United States Patent [19]
Song

[11] Patent Number: 6,055,814
[45] Date of Patent: May 2, 2000

[54] METHOD OF AND APPARATUS FOR COOLING AN OPERATING SYSTEM USING THE PELTIER EFFECT

[75] Inventor: Byoung-soo Song, Kyonggi-do, Rep. of Korea

[73] Assignee: Samsung Electronics Co., Ltd., Suwon, Rep. of Korea

[21] Appl. No.: 09/166,225

[22] Filed: Oct. 5, 1998

[30] Foreign Application Priority Data

Jan. 14, 1998 [KR] Rep. of Korea ......................... 806/806

[51] Int. Cl.⁷ .................................................. F25B 21/02
[52] U.S. Cl. .................................. 62/3.2; 62/3.6; 62/3.7; 62/259.2
[58] Field of Search .................................. 62/259.2, 3.2, 62/3.6, 3.7

[56] References Cited

U.S. PATENT DOCUMENTS

| | | | |
|---|---|---|---|
| 5,605,047 | 2/1997 | Park et al. | 62/3.6 |
| 5,638,896 | 6/1997 | Nishino et al. | 62/3.6 |
| 5,655,375 | 8/1997 | Ju | 62/3.2 |
| 5,661,978 | 9/1997 | Holmes et al. | 62/3.6 |
| 5,816,051 | 10/1998 | Hall et al. | 62/3.2 |

*Primary Examiner*—Henry Bennett
*Assistant Examiner*—Mark Shulman
*Attorney, Agent, or Firm*—Jones Volentine, LLP

[57] ABSTRACT

An operating system to be cooled is formed as a non-flow system so that the system can be protected from contaminants which could otherwise enter the system. When the temperature in the system is above a certain level, heat in the system is absorbed by a Peltier module utilizing a Peltier effect. A convection fan forces the air that is cooled by the Peltier module throughout the system.

5 Claims, 4 Drawing Sheets

METHOD OF AND APPARATUS FOR COOLING AN OPERATING SYSTEM USING THE PELTIER EFFECT

BACKGROUND OF THE INVENTION

1. Field of the Invention

The present invention relates to a method of and apparatus for cooling a system in which heat is generated as part of the normal operation of the system. More particularly, the present invention relates to a method of and apparatus for exhausting heat from a system into and out of which objects are not allowed to enter and exit (non-flow type of system).

2. Description of the Related Art

As is widely known, operating systems such as those of computers, communication devices, and electronic apparatus, generally have heat sources such as printed circuit boards, various interface cards and transformers. The heat sources generate heat which, if not dealt with, increases the temperature in the system. High temperatures can reduce the performance of the components of the system and even shorten the useful life of the components.

Thus, these types of systems which have heat sources are often provided with a cooling system to remove the heat generated by the heat sources.

In this respect, conventional systems are cooled by either positive pressure cooling technology or negative pressure cooling technology. The positive pressure cooling technology forcibly draws cool air into the system from the outside. On the other hand, negative pressure cooling technology establishes a negative pressure in the system by exhausting hot air from the system, whereby cool air is induced into the system from the outside.

The systems which can be cooled by the positive and the negative pressure cooling technologies need to be open systems, meaning that these systems allow some physical object, i.e., air, to be moved under pressure out of the system.

Systems employing the negative and positive pressure cooling technologies are illustrated in FIGS. 1 and 2, respectively.

Referring to FIGS. 1 and 2, a plurality of heat sources 2, 4, 6 and 8 are disposed in a housing 10b. Heat generated by the heat sources 2, 4, 6 and 8 is exhausted out of the system 10 by a cooling fan 3. More particularly, the housing 10b includes at least two ports 10a and 10a'. One of the two ports is an intake port and the other is an exhaust port. Cool air is taken into the housing 10b from the outside through the intake port. The intake cool air is mixed with hot air in the system 10 and then is forced out of the system 10 through the exhaust port.

In the system employing the positive pressure cooling technology, the cooling fan 3 is mounted in the intake port 10a' as shown in FIG. 2. In the system employing the negative pressure technology, the cooling fan 3 is mounted in the exhaust port 10a' as shown in FIG. 1.

The cooling fan 3 is connected to a control module 1. The cooling fan 3 is turned on or off by the control module 1. A temperature sensor 1a is also connected to the control module 1. The temperature in the system 10 is detected by the temperature sensor 1a and the detected temperature is inputted to the control module 1 as an electric signal.

The control module 1 receives the electric signal from the temperature sensor 1a and compares the received electric signal to a predesignated reference temperature. If the reference temperature is higher than the temperature detected by the temperature sensor 1a, the control module 1 supplies the cooling fan 3 with direct current so that negative pressure is created in the system 10 and cool air is induced into the system 10 from the outside as shown in FIG. 1, or cool air is forcibly drawn into the system 10 from the outside as shown in FIG. 2. As a result, the system is cooled.

In either case, cool air must be introduced into the system from the outside. However, fibrous materials and conductive particles may be introduced into the system together with the cool air. Such fibrous materials and conductive particles can accumulate between the wires of electric components, and semiconductor packages etc. mounted on printed circuit boards installed in the system. This in turn can increase the resistance of the wires, or short the wires, and thereby increase the temperature in the system.

SUMMARY OF THE INVENTION

It is therefore an object of the present invention to provide a cooling method and apparatus for cooling a system which produces heat when operating and which cooling apparatus and method does not allow contaminants to enter the system.

To achieve this object, the present invention forms the system as a nonflow system, and provides a cooling module in the boundary between the inside and the outside of the system and a cool air convection unit for distributing cool air throughout the system. The cooling module both absorbs heat generated in the non-flow system and radiates the heat to the outside using the Peltier effect. The cool air convection unit ensures that all areas in the system are sufficiently cooled.

The apparatus of the present invention also includes a temperature sensor and a control unit connected thereto. The temperature sensor senses the temperature within the system and inputs a signal indicative of the detected temperature to the control unit. The control unit compares the temperature detected by the temperature sensor and a predetermined temperature, and supplies the cooling module with direct current when the detected temperature is higher than the predetermined temperature.

The method of cooling the system includes the steps of: detecting the temperature in the system; comparing the detected temperature with a predetermined temperature; and supplying direct current to the cooling module to create the Peltier effect and operating the cool air convection unit when the detected temperature is higher than a predetermined temperature.

Once the direct current is supplied to the Peltier module and the convection fan and a predetermined amount of time goes by, the temperature of the system is once again detected; the newly detected temperature is compared with the predetermined temperature; and the Peltier module and the convection fan are supplied with a greater current if the newly detected temperature is also higher than the predetermined temperature.

Once the detected temperature is lower than the predetermined temperature, the supply of direct current to the Peltier module and the convection fan is cut off.

BRIEF DESCRIPTION OF THE DRAWINGS

The above and other objects and advantages of the present invention will become more apparent from the following detailed description of the preferred embodiments thereof made with reference to the accompanying drawings, of which.

DETAILED DESCRIPTION OF THE PREFERRED EMBODIMENTS

The present invention will now be described more fully hereinafter with reference to the accompanying drawings.

Figure 1:
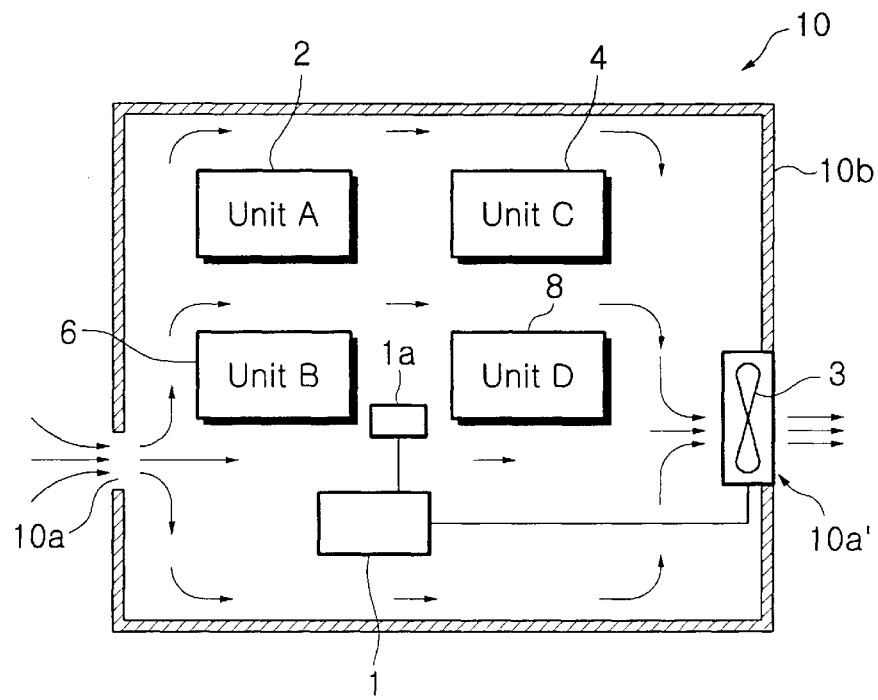
FIG. 1 is a schematic diagram of a system employing conventional negative pressure cooling technology.
Figure 2:
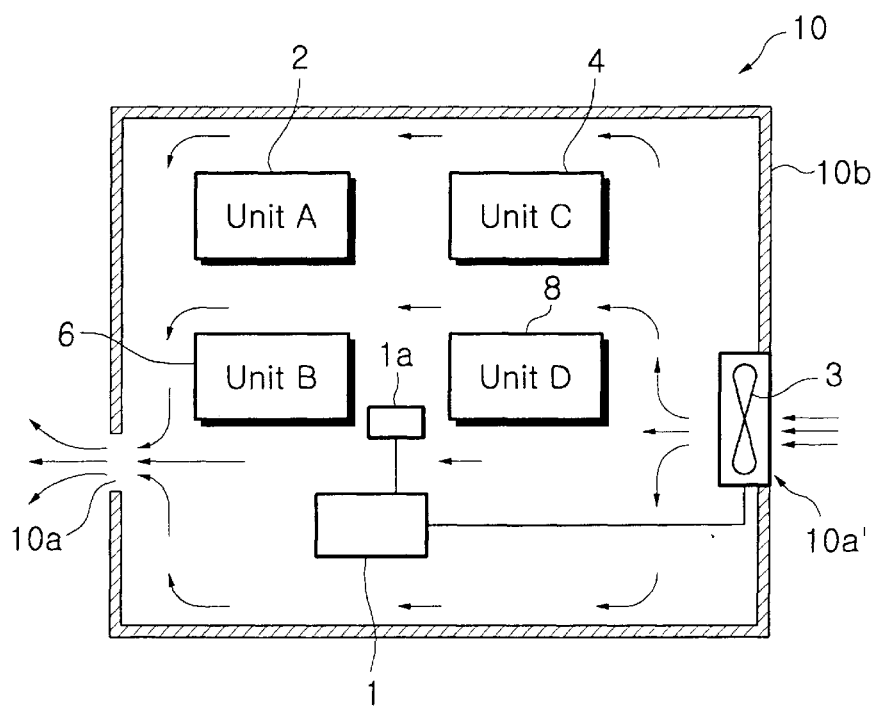
FIG. 2 is a schematic diagram of a system employing conventional positive pressure cooling technology.
Figure 3:
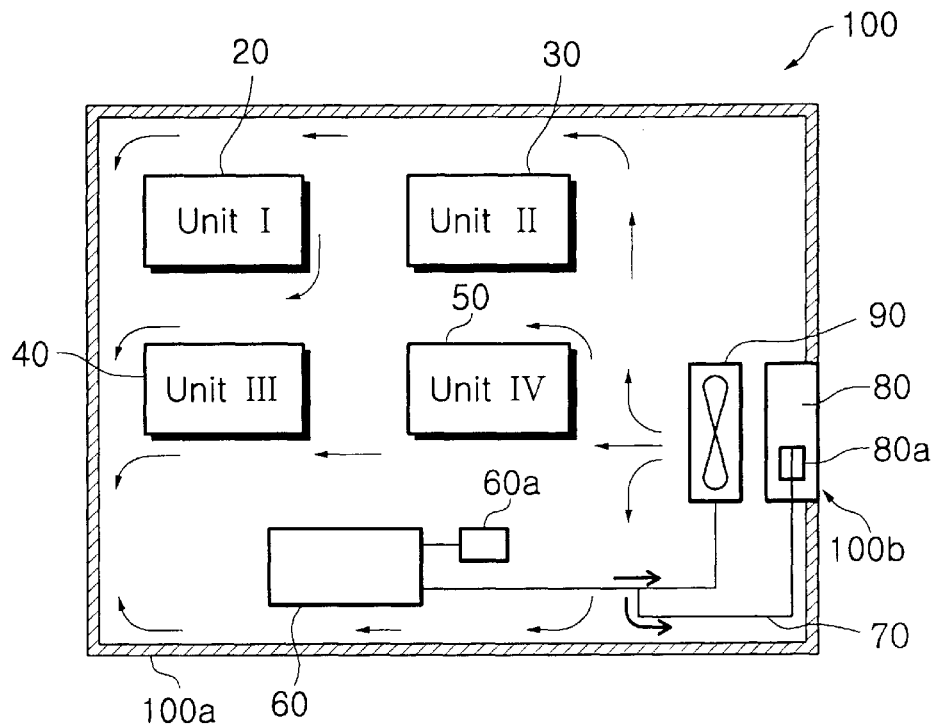
FIG. 3 is a schematic diagram of a non-flow system employing a cooling apparatus according to the present invention.

As shown in FIG. 3, the system 100 includes a housing 100a in which a plurality of units 20, 30, 40 and 50 are disposed. When these units perform their specified functions they generate heat which increases the temperature within the housing 100a. A Peltier module 80 exhausts the heat generated by the plurality of units 20, 30, 40 and 50 to the outside of the housing 100a under the control of a control module 60. That is, the control module 60 turns the Peltier module 80 on or off depending on the temperature of the air in the housing 100a. A convection fan 90 ensures that all regions of the system 100 are sufficiently cooled when the Peltier module 80 is operating.

Figure 4:
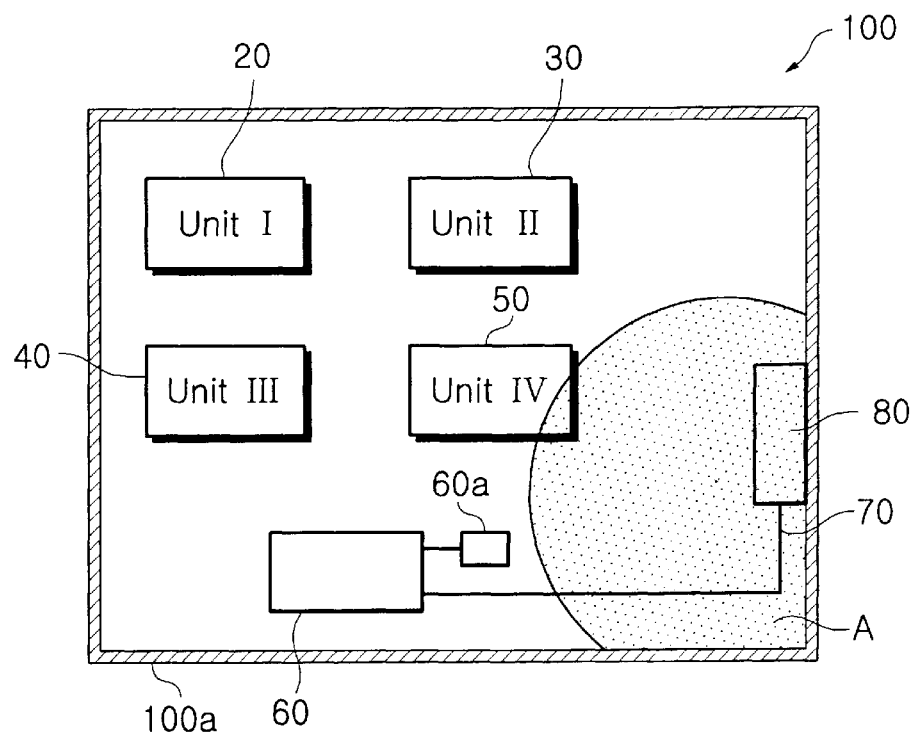
FIG. 4 is a schematic diagram of a non-flow system having a cooling apparatus which does not include a convection unit.
Figure 5:
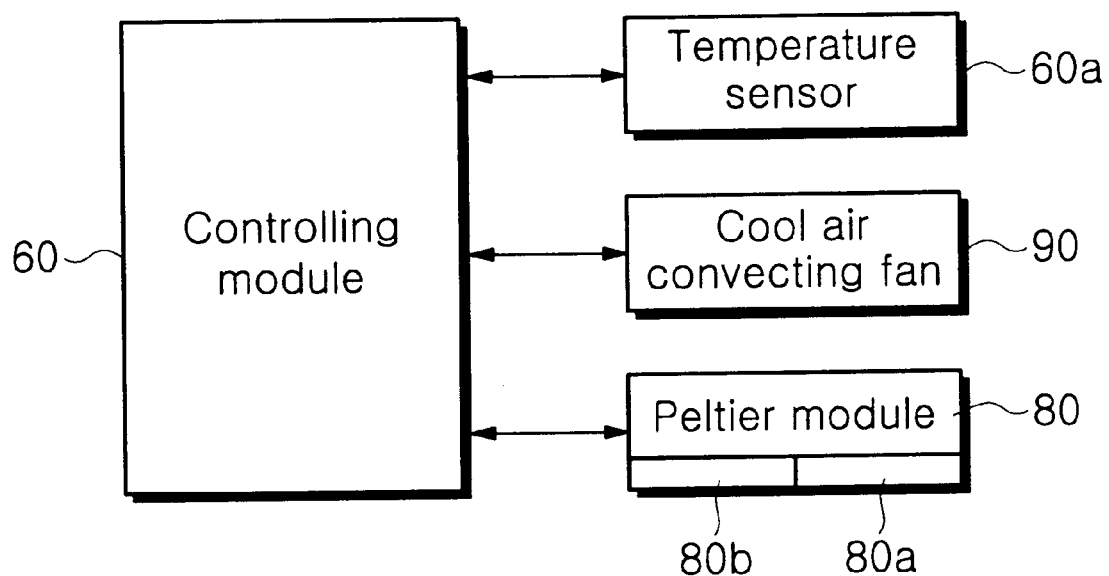
FIG. 5 is a block diagram of the non-flow system employing a cooling apparatus according to the present invention.

Referring now to FIGS. 3 through 5, the housing 100a has at least one opening 100b therethrough. The Peltier module 80 is mounted in the opening 100b and is hermetically sealed to the housing 100a.

The Peltier module 80 utilizes the so-called Peltier effect in which heat is radiated or absorbed at the junction of two dissimilar metals, through which a small current is passed, depending upon the direction of the current through the junction. Recently, a new semiconductor thermoelement (i.e., a cooling chip) has been developed, which utilizes a principle similar to the Peltier effect and provides excellent cooling efficiency as compared to existing thermoelements.

The Peltier module 80 includes a Peltier cooling chip 80a. One surface of the cooling chip 80a serves as a cooling surface for absorbing heat and the other surface thereof serves as a radiating surface for radiating heat.

Careful attention should be paid to the fact that the direction of the direct current supplied to the cooling chip determines which of the surfaces will wind up acting as the cooling surface. Accordingly, in the present invention, the direction of the direct current is selected so that the surface of the cooling chip facing the inside of the housing 100a will absorb heat and the surface of the chip exposed to the outside of the housing 100a via the opening 100b will radiate heat.

The Peltier module 80 also includes a power receiving terminal 80b (not shown in FIG. 3) for receiving a direct current. The power receiving terminal 80b is connected to a power supply terminal of the control module 60 through a cable 70.

A temperature sensor 60a is provided for detecting the temperature in the system 100, which temperature is used to determine whether the Peltier module 80 is to be supplied with direct current. For example, the temperature sensor 60a includes a thermocouple and an analog to digital converter (A/D converter) which converts analog signals to digital signals generated in the thermocouple.

The A/D converter of the temperature sensor 60a is electrically connected to the control module 60 so that the temperature detected by the temperature sensor 60a is inputted to the control module 60.

The control module 60 compares the temperature detected by the temperature sensor 6a with a temperature that is predesignated in the control module 60, and supplies the Peltier module 80 with a direct current when the detected temperature is higher than the predetermined temperature. The amplitude of the direct current is determined according to the detected temperature.

In other words, when the system is turned on, the control module 60 determines and adjusts the amplitude of the current to be supplied to the Peltier module 80 according to the difference between the detected temperature and the predetermined temperature.

Accordingly, the surface of the Peltier module is cooled and absorbs the heat contained in the air near the Peltier module 80. As a result, the air in the system 100 heated by the heat sources 20, 30, 40 and 50 is cooled.

At this time, the air in the area A near the Peltier module 80 is rapidly cooled as shown in FIG. 4. However, if no measures were taken, the air beyond the area A would only be cooled slowly.

The amount of time taken to cool the areas in the system with just the Peltier module would differ significantly because the system 100 is formed as a non-flow type of system to prevent the system from being contaminated by particles, and fibrous materials, etc.

To establish a high cooling efficiency, the system 100 of the present invention includes a convection fan 90. The convection fan 90 is preferably is disposed in contact with or near the Peltier module 80. Preferably, the convection fan 90 preferably has a variable speed motor capable of varying the rotational speed of the blades thereof according to the amplitude of the direct current supplied thereto.

The convection fan 90 and the Peltier module 80 are connected in parallel to the control module 60. Accordingly, the convection fan 90 is supplied with a direct current at the same time that the Peltier module 80 is supplied with the direct current. Furthermore, the direct current supplied to the Peltier module 80 is proportional to the direct current supplied to the convection fan 90.

Figure 6:
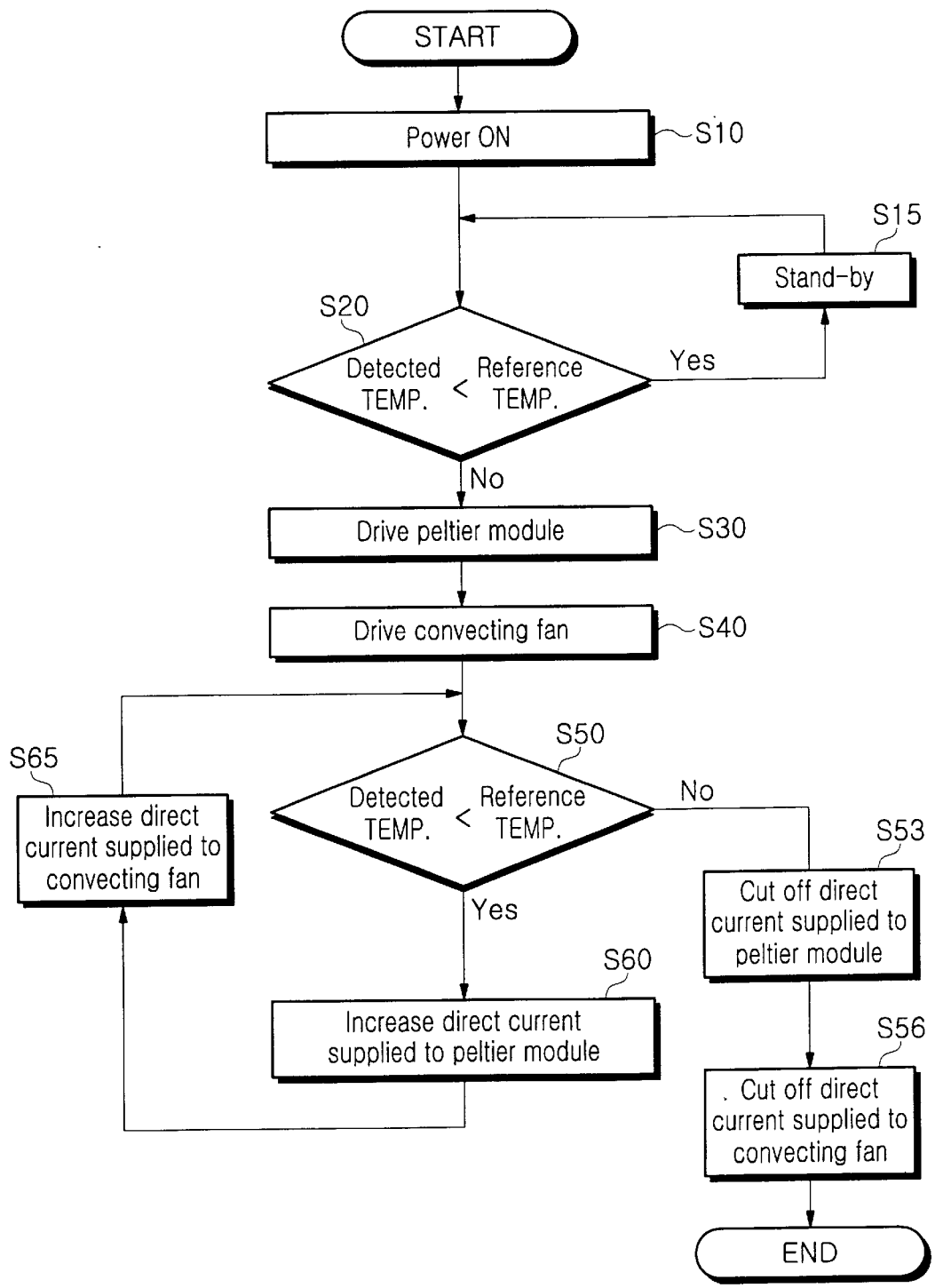
FIG. 6 is a flow chart of a method of cooling a system according to the present invention.

The method of cooling the system will now be described with reference to FIG. 6. When the system 100 is turned on (Step S10), the control module 60 of the system 100 operates the units 20, 30, 40 and 50 which then begin to generate heat. While the units 20, 30, 40 and 50 are operating, the control module 60 receives a signal corresponding to the temperature of the system 100 detected by the thermocouple of the temperature sensor 60a. Then, the control module 60 compares the received signal with a Peltier module operating temperature, i.e., a predetermined reference temperature, and determines whether the temperature of the system 100 is lower than the reference temperature (Step S20).

If the temperature of the system 100 is lower than the reference temperature, there is no need to operate the Peltier module 80. Accordingly, the control module 60 assumes a stand-by state and continues to receive signals indicative of the temperature of the system on a periodic basis (Step S15).

If the temperature of the system 100 is higher than the reference temperature, the control module 60 supplies a direct current, of an amplitude based on the detected temperature, to the Peltier module 80. The Peltier module 80 thus begins to operate to cool the system 100 (Step S30).

At the same time that the direct current is supplied to the Peltier module 80 by the control module 60, the direct current is supplied to the convection fan 90.

As a result, the convection fan 90 is driven at a rate proportional to the direct current. Therefore, the cool air that is produced in the system 100 by the Peltier module 80 is distributed throughout the casing 100a by the convection fan 90 (Step S40).

When a predetermined amount of time elapses after the cool air begins to be distributed in the system 100, the control module 60 determines again whether the temperature of the system 100 is higher than the reference temperature (Step S50).

If the temperature of the system 100 remains higher than the reference temperature, the control module 60 increases the direct current supplied to the Peltier module 80 to increase the degree to which the system 100 is cooled by the Peltier module (Step S60). Generally speaking, the greater the direct current supplied to the Peltier module 80, the more the system 100 is cooled.

When the direct current supplied to the Peltier module 80 is increased by the control module 60, the direct current supplied to the convecting fan 90 is also increased in proportion (Step S65). As a result, the rotational speed of the convention fan 90 is adjusted to accommodate for the increase in the cooling performance of the Peltier module 80.

Thereafter, the method proceeds again from Step S50. That is, after a predetermined amount of time elapses from when the direct current to the Peltier module 80 and convection fan 90 was increased, another determination is made as to whether the temperature of the system 100 is higher than the reference temperature.

Once the temperature of the system 100 becomes lower than the reference temperature, the direct current supplied to the Peltier module 80 and the convection fan 90 is cut off (Steps S53 and S56). In this way, the temperature of the system 100 can be maintained at a predetermined level.

As is clear from the description above, because the system is a non-flow system in which physical objects (including air) cannot enter the system from the outside, and only energy (heat, electrical) can be transferred between the inside and outside of the system, the system is not easily contaminated. However, because the system includes a Peltier module at the boundary between the inside and the outside thereof, the system can nonetheless be cooled and thus kept at a predetermined temperature/temperature range. A convection fan ensures that even the far reaches of the system are cooled by the Peltier module. Accordingly, the performance of the operating units of system is prevented from being degraded.

Although the present invention has been described above with reference to the preferred embodiments thereof, many alternatives, modifications and variations thereof will be apparent to those of ordinary skill in the art. Accordingly, all such alternatives, modifications and variations are seen to be within the true spirit and scope of the invention as defined by the appended claims.

What is claimed is:

1. An operating system comprising:

a housing having an opening therethrough, said housing constituting a boundary past which physical objects are prevented from entering the housing from outside the housing;

a plurality of operating units disposed in said housing, said plurality of units generating heat when operating;

a temperature sensor which detects the temperature inside of said housing;

a Peltier module mounted in said opening and hermetically sealed therein to said housing, said Peltier module having a cooling chip having a first surface facing the inside of said housing and a second surface facing the outside of said housing, said cooling chip comprising two dissimilar metals contacting each other at a junction and producing a Peltier effect when electric current passes through said junction, the Peltier effect causing said first surface of the cooling chip to absorb heat and said second surface of the chip to radiate heat when the electric current flows through said junction in one direction, whereby air in a region adjacent said first surface is cooled;

a fan having a variable speed motor and disposed in said housing for forcing the air in said region throughout the interior of said housing; and a control module including a common source of electric power to which said fan and said Peltier module are connected in parallel, said control module being operatively connected to said temperature sensor so as to compare the temperature detected by said temperature sensor with a predetermined reference temperature, and to supply the cooling chip of said Peltier module with a direct current flowing in said one direction and the variable speed motor of said fan with current in an amount proportional to that supplied to the cooling chip when the detected temperature is higher than said predetermined reference temperature.

2. The apparatus according to claim 1, wherein said fan is disposed adjacent said Peltier module.

3. A method of cooling an operating system having units which generate heat when operating, and a housing in which said units are disposed, the housing constituting a boundary past which physical objects are prevented from entering the housing from outside the housing, said method comprising the steps of:

detecting the temperature within said housing;

comparing the detected temperature with a predetermined reference temperature;

if the detected temperature is higher than the predetermined reference temperature, passing electric current through a junction of two dissimilar metals of a Peltier chip, provided in a module mounted in an opening in the housing, in a direction that gives rise to a Peltier effect in which a first surface of the chip facing the inside of the housing will absorb heat and a second surface of the chip exposed to the outside of the housing will radiate heat to cool air in a region adjacent the first surface; and at the same time electric current is supplied to the Peltier chip, driving a fan at a rate proportional to a cooling performance of the Peltier chip to distribute the air in said region throughout the housing, by delivering electric current to said fan and to said Peltier chip from a common source of electric power.

4. The method according to claim 3, and further comprising the steps of:
- detecting the temperature within said housing again once a predetermined amount of time has elapsed from when the electric current is first supplied to the Peltier chip and the fan; and
- comparing the newly detected temperature with the predetermined reference temperature, and supplying the Peltier chip and the fan with a direct current that is greater than that supplied said first time if the newly detected temperature is higher than the predetermined reference temperature.

5. The method according to claim 4, and further comprising the step of cutting off the supply of direct current to the Peltier chip and the fan when the temperature in the housing becomes lower than the predetermined reference temperature.

* * * * *